United States Patent
Yun et al.

(10) Patent No.: US 6,885,503 B2
(45) Date of Patent: Apr. 26, 2005

(54) ACHROMATIC FRESNEL OPTICS BASED LITHOGRAPHY FOR SHORT WAVELENGTH ELECTROMAGNETIC RADIATIONS

(75) Inventors: Wenbing Yun, Walnut Creek, CA (US); Yuxin Wang, Arlington Heights, IL (US); Kenneth W. Nill, Lexington, MA (US)

(73) Assignee: Xradia, Inc., Concord, CA (US)

( * ) Notice: Subject to any disclaimer, the term of this patent is extended or adjusted under 35 U.S.C. 154(b) by 170 days.

(21) Appl. No.: 10/289,151

(22) Filed: Nov. 5, 2002

(65) Prior Publication Data

US 2004/0085641 A1 May 6, 2004

Related U.S. Application Data

(63) Continuation-in-part of application No. 10/134,026, filed on Apr. 25, 2002.
(60) Provisional application No. 60/337,752, filed on Nov. 9, 2001, and provisional application No. 60/338,362, filed on Nov. 9, 2001.

(51) Int. Cl.$^7$ .............................................. G02B 27/44
(52) U.S. Cl. ..................... 359/565; 359/558; 359/569; 359/351; 359/355; 355/53; 355/55
(58) Field of Search ................................ 359/565, 558, 359/569, 350, 355, 361, 351; 355/53, 55, 67

(56) References Cited

U.S. PATENT DOCUMENTS

| | | | |
|---|---|---|---|
| 5,161,057 A | 11/1992 | Johnson | |
| 5,161,059 A | 11/1992 | Swanson et al. | |
| 5,349,471 A | 9/1994 | Morris et al. | |
| 5,453,880 A | 9/1995 | Vanderwerf | |
| 5,559,338 A | * 9/1996 | Elliott et al. | 250/492.1 |
| 5,926,318 A | 7/1999 | Hebert | |
| 6,285,737 B1 | 9/2001 | Sweatt et al. | |
| 6,483,638 B1 | * 11/2002 | Shafer et al. | 359/351 |
| 2002/0005938 A1 | 1/2002 | Omura | |

FOREIGN PATENT DOCUMENTS

| | | |
|---|---|---|
| EP | 1 006 400 A2 | 6/2000 |
| EP | 1 006 400 A3 | 5/2003 |

* cited by examiner

Primary Examiner—Fayez G. Assaf
(74) Attorney, Agent, or Firm—John P. O'Banion

(57) ABSTRACT

A lithography apparatus having achromatic Fresnel objective (AFO) that combines a Fresnel zone plate and a refractive Fresnel lens. The zone plate provides high resolution for imaging and focusing, while the refractive lens takes advantage of the refraction index change properties of appropriate elements near absorption edges to recombine the electromagnetic radiation of different energies dispersed by the zone plate. This compound lens effectively solves the high chromatic aberration problem of zone plates. The lithography apparatus allows the use of short wavelength radiation in the 1–15 nm spectral range to print high resolution features as small as 20 nm.

39 Claims, 10 Drawing Sheets

ACHROMATIC FRESNEL OPTICS BASED LITHOGRAPHY FOR SHORT WAVELENGTH ELECTROMAGNETIC RADIATIONS

CROSS-REFERENCE TO RELATED APPLICATIONS

This application is a continuation-in-part of copending U.S. application Ser. No. 10/134,026 filed on Apr. 25, 2002, incorporated herein by reference, which claims priority from U.S. provisional application Ser. No. 60/337,752 filed on Nov. 9, 2001, incorporated herein by reference. This application also claims priority from U.S. provisional application Ser. No. 60/338,362 filed on Nov. 9, 2001 and incorporated herein by reference.

STATEMENT REGARDING FEDERALLY SPONSORED RESEARCH OR DEVELOPMENT

Not Applicable

REFERENCE TO A COMPUTER PROGRAM APPENDIX

Not Applicable

BACKGROUND OF THE INVENTION

1. Field of the Invention

The present invention pertains generally to lithography, and more specifically to lithography methods using short wavelength electromagnetic radiation.

2. Description of the Background Art

Lithography has been the key enabling technology for the steady performance improvement in semiconductor integrated circuit (IC) devices over the last thirty years. By reducing the feature size, the density of components as well as the speed and functionality of microchips have doubled every two to three years. The current generation of lithography methods employ visible or ultraviolet light and refractive lens objectives to image the mask pattern onto a pattern-forming resist layer on a wafer and subsequently develop the latent image to complete a pattern transfer process. Since the printable feature size is limited by the wavelength of the light, ever decreasing wavelengths are being used for lithography applications. Further reduction in wavelength using current refractive lens-based lithography methods can be extremely difficult and is limited by a lack of suitable materials for making the imaging lenses.

This difficulty was recognized more than ten (10) years ago and alternative lithography methods (collectively known as the next-generation lithography methods) are currently being developed. The next-generation lithography (NGL) methods employ either charged particle beams, e.g., electron and ion, or electromagnetic radiations having wavelengths substantially shorter than one-hundred and fifty-seven nanometers (157 nm)—the shortest wavelength to be used in the current generation lithography tools. At various times, next-generation lithography methods have included proximity X-ray lithography, ion projection lithography, extreme ultraviolet lithography (EUVL), and electron beam projection lithography (EPL). Presently, EUVL and EPL are considered the most promising candidates.

The EUVL method employs extreme ultraviolet radiation having a wavelength of approximately thirteen nanometers (13 nm). A EUVL lithography camera typically consists of 4 to 6 aspherical multilayer mirrors arranged at near-normal incidence, which require a demanding multilayer coating (often with a gradation in multilayer period across the optic) on large diameter aspherical optical mirror surfaces with figure control at almost the atomic level. The camera is not axially symmetric but has a ring-shaped printing field. To produce an illumination field matching that of the printing field of the camera, a condenser consisting of a large number of multilayer mirrors is required. For example, the Engineering Test Stand (ETS) developed by the EUVL LLC and the virtual national laboratory has ~20 multilayer mirrors in the condenser and has 4 multilayer mirrors in the camera. Radiation arriving at the photoresist experiences nine reflections from its origin at the source. The number of multilayer mirrors and thus the number of reflections in the camera may increase by two in EUVL cameras designed to achieve resolution better than 50 nm. Because of the large number of multilayer mirrors must be used, only a small percentage of the EUV source power is delivered to the wafer, while a large amount flare is added to the exposure. The large number of multilayer mirrors also imposes stringent requirement on the precise matching of the multilayer spacings, alignment, mechanical and vibrational stability. Consequently the costs of initial tool, replacement, and maintenance are extremely high.

Camera designs based on optics developed for x-ray microscopy have also been proposed. Transmission objectives developed for x-ray focusing and imaging applications include zone plates and compound refractive lenses. A compound refractive lens consists of many spherical or parabolic shaped lenses aligned along the optical axis. A large number of individual lenses are needed to obtain a short effective focal length because the focal length is inversely proportional to the number of lenses, which typically have a focal length of tens to hundreds of meters. Therefore, compound refractive lenses are not likely to be useful as objectives in the next generation lithography methods because they do not have the required numerical aperture with an acceptable system throughput.

Zone plates consist of concentric rings with alternative materials. The positions of the rings are determined by a simple equation and the ring width decreases with increasing radius. They are currently the highest resolution transmissive optic, demonstrating a resolution of better than 25 nm in the 2–5 nm spectral region. The focal length of a zone plate lens is inversely proportional to wavelength and therefore the zone plate is highly chromatic. This chromaticity precludes its application in lithographic imaging cameras since an illumination beam with an extremely narrow spectral bandwidth would be required to limit chromatic aberrations should a printing field of sufficient size be required. This would consequently severely limit the energy from the source that can be used for exposing the photoresist.

BRIEF SUMMARY OF THE INVENTION

The present invention seeks to provide a lithography method that overcomes one or more of the above-described shortcomings with a camera based on an optic that corrects the chromatic aberration problem of a Fresnel zone plate with a weakly-focusing refractive Fresnel lens having chromatic aberrations with opposite sign.

In general terms, the present invention is a lithography method using a new type of transmission optic for short wavelength electromagnetic radiations. The method offers many desirable properties over the EUVL that is currently been developed, including possibly simpler system design and higher system throughput.

The lithography method of the present invention employs an achromatic Fresnel objective (AFO) that combines a diffractive Fresnel zone plate with a refractive Fresnel lens to cancel chromatic aberration that exist in both type of lenses. The AFO is used as a imaging optic to image a pattern on a mask onto a suitable resist layer on a wafer. A desired design structure can be printed and produced on the wafer using established processing steps.

By way of example, and not of limitation, the present invention includes four achromatic Fresnel optics based lithography system designs. All four designs employ one or more AFOs to image the mask onto a wafer. The first three designs are for use with transmissive masks having a patterned structure supported on thin membranes. The patterned structure is designed to modify the transmitted radiation by attenuation or phase shifting to achieve an emerging wave front with predetermined properties. The difference between the first two designs is the condenser. The condenser in the first design is a multilayer spherical mirror operating in the back reflection geometry. In the second design, the condenser is a multilayer mirror operating at incidence angle significantly larger than ten degrees and is better suited for wavelengths less than 4 nm. The third design is for reflective masks consisting of patterned structure on a multilayer substrate acting as a reflecting mirror, similar to the masks to be used in EUVL designs. The fourth design utilizes an array of AFOs instead of a single one as in the previous two designs. In this configuration, each AFO will image a portion of the pattern, while the entire mask pattern is imaged in parallel by the AFO array to the wafer. In this design, the arrangement of the condenser and mask can be any one of the previous three configurations.

The inventive AFO provides a method for correcting the chromatic aberration problem of a zone plate by using a weakly-focusing refractive Fresnel lens having similar degree of chromatic aberrations but with opposite sign within up to 5% spectral bandwidth at a designed operational wavelength (DOW). This DOW depends on the dispersion property of the material from which the refractive correction lens is made, and is slightly longer in wavelength than the wavelength of an absorption edge. The dispersion of the refractive index near a DOW is large, and thus the focal length of the refractive Fresnel lens, which is inversely proportional to the refractive index, varies rapidly with wavelength. The large dispersion makes it possible to use a weakly-focusing refractive lens to correct the zone plate's chromaticity while keeping the numerical aperture of the compound lens approximately that of the zone plate alone.

The weak focusing requirement for the refractive Fresnel lens means that its radius of curvature is large and thus its fabrication is be relatively straightforward. For example, a refractive Fresnel lens made of silicon has a DOW of 13.4 nm, and the dispersion near this resonance can be used to produce an AFO with 1.2% bandwidth, a 9 square millimeter printing field, a 30-nm resolution and >30% throughput. Other examples can be cited of AFO lenses operating at other DOWs in the 1–15 nm EUV and XUV spectral regions, such as a copper Fresnel lens at DOW of ~1.3 nm (near a Cu L-absorption edge).

The AFO offers a new lithography concept with many advantages, including, (a) a smaller minimum printable feature size; resolution better than 30-nm can be expected because zone plate based imaging microscope operating at 2–5 nm wavelength radiation have routinely obtained spatial resolutions better than 25 nm; (b) an axial symmetric printing field, instead of the ring-shaped printing field of proposed EUVL systems; (c) a high, in-band, throughput due to the smaller number of optics involved and because the AFO and condenser can be made with high throughput; (d), an opportunity for increasing the depth of focus over that of EUVL by using shorter wavelengths if desired; and (e) a simpler optical train with a small number of axially-symmetric elements. The simplicity of the optical system design and small number of optics involved may have positive implications in reducing the overall system complexity, the initial cost of lithography tool, and the cost of ownership.

The axially symmetric transmission AFO is similar to the cameras in the current generation lithography steppers, and may permit simple replacement and thus easy transition to next-generation lithography (NGL). In addition to the advantages normally associated with lithography using short wavelength radiation, AFO lithography (AFOL) as a NGL camera may deliver substantial economic benefits. Therefore, the AFOL may be considered as the ultimate extension of the current generation lithography technology into the EUV and beyond.

Accordingly, an aspect of the invention is a lithography apparatus having at least one AFO configured for focusing radiation passing through a mask onto a wafer. Preferably, the AFO comprises a diffractive lens in the form of a Fresnel zone plate and a refractive lens in the form of a Fresnel lens where the diffractive lens and the refractive lens are formed on opposite sides of a common substrate and configured to cancel chromatic aberration in both lenses.

Another aspect of the invention is a lithography apparatus having at least one condenser and at least one achromatic Fresnel objective. The condenser can comprise a multi-layer mirror spherical or elliptical mirror or an AFO.

Another aspect of the invention is to provide a lithography apparatus having at least one radiation source positioned optically upstream of the condenser where the radiation source is selected from the group consisting essentially of a laser-plasma source, a synchrotron source, a discharge-capillary source, a z-pinch plasma source, a discharge-pump x-ray laser source, and an electron bombardment source.

Another aspect of the invention is to provide a lithography apparatus using a transmissive or a reflective mask.

Another aspect of the invention is to illuminate a beam of radiation on a mask and image at least a portion of a pattern on said mask from said mask to a wafer by an achromatic Fresnel objective.

Another aspect of the invention is to use a step-scan method to print entire said pattern from said mask to the wafer.

Further aspects of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Figure 1B:
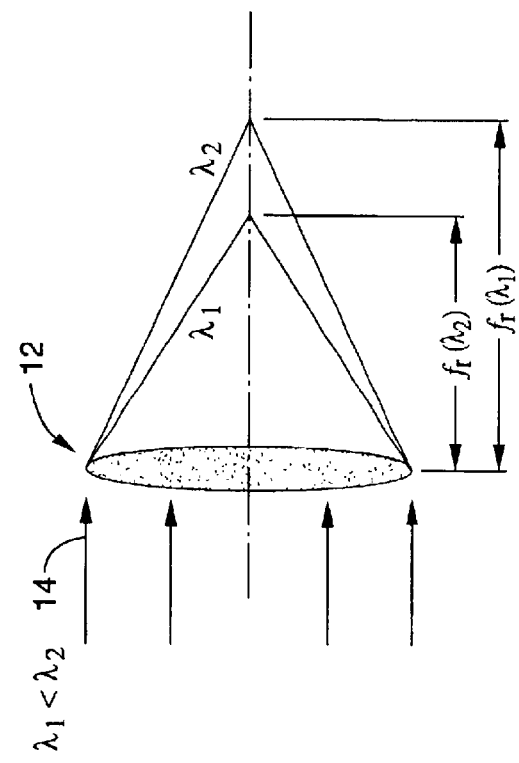
FIG. 1A through FIG. 1C are schematic diagrams illustrating an AFO comprising a Fresnel zone plate and a refractive Fresnel lens according to the present invention.

The preferred embodiments of lithography methods and systems based on an achromatic Fresnel objective, or AFO lens, according to the present invention will now be described. The inventive AFO combines a diffractive Fresnel zone plate for high-resolution image transfer, and a refractive Fresnel lens for chromaticity correction. It can achieve the demonstrated high resolution of zone plates, with the spectral bandpass of multilayer-coated optics. An AFO lithography (AFOL) system according to the present invention is capable of sub-30 nm patterning over an axially symmetric printing field of many square millimeters. The calculated maximum throughput of the imaging system consisting of a condenser and an AFO camera is >20%. The AFOL's axially symmetric transmission imaging system is similar to that of the current generation lithography technology and, therefore, it may be considered as its ultimate extension.

It will be appreciated that a Fresnel zone plate is a diffractive imaging optic comprising a set of concentric rings with the ring (zone) width decreasing with radius and that several research groups have demonstrated imaging at sub-30 nm resolution in the 2–5 nm wavelength range, which is the highest resolution demonstrated for the entire spectrum of electromagnetic radiation. A Fresnel zone plate is characterized by its radius R, the width of the outermost zone $\Delta R$, and the number of zones N. The resolution of a zone plate according to the Rayleigh criteria is $1.22\Delta R$ under appropriate illumination conditions. The imaging property of a zone plate is identical to that of a thin lens with a focal length $$f_z = \frac{2R\Delta R}{\lambda}.$$

The focal length is inversely proportional to the wavelength, and therefore chromatic. To obtain the intrinsic resolution $1.22\Delta R$ of a zone plate, image blurring due to chromatic aberration needs to be controlled. Up to now, the only method for controlling the chromatic aberration has been to use a beam with a sufficiently narrow spectral bandwidth. It is well established that the spectral bandwidth required is $$\frac{\Delta\lambda}{\lambda} = \frac{1}{N},$$

where N is the number of zones. This requirement effectively rules out zone plates as imaging optics in lithography because an extremely narrow spectral bandwidth is required for printing a large area with a high resolution. For example, printing a 10 mm² area with a 50 nm node size would require a spectral bandwidth less than $3\times10^{-5}$, which would mean that radiation from a source have to be monochromatized to an impractical level, leaving little power for exposing the resist.

The AFO of the present invention uses a refractive Fresnel lens to correct the zone plate's chromatic aberration and overcome its limitation for large-area and high-resolution imaging. This refractive Fresnel lens operates on similar principle of refraction as a conventional lens for visible light. The focal length of a refractive lens with a single refractive lens surface is given by $$f_r = -\frac{R_c}{\delta},$$

where $R_c$ is the lens radius of curvature, $1-\delta=1-\alpha\lambda^2 f_1$ is the real part of the refractive index $n=1-\delta-i\beta$ of the lens material for EUV and shorter wavelength radiation, $\alpha$ is a constant dependent on the Fresnel lens material and lens thickness, and $f_1$ is the real part of atomic scattering factor. The focal length of the refractive Fresnel lens varies as $$f_r \propto \frac{R_c}{\lambda^2 f_1},$$

so that it is a chromatic lens and cannot be used alone as an imaging optic in lithography for the same limited-bandwidth reason that precludes use of a zone plate. The AFO takes advantage of the chromatic characteristics of both types of optics by combining a diffractive Fresnel zone plate and a refractive Fresnel lens such that the chromatic aberrations cancel. The resulting achromat can have a bandwidth of up to 5%.

Figure 1C:
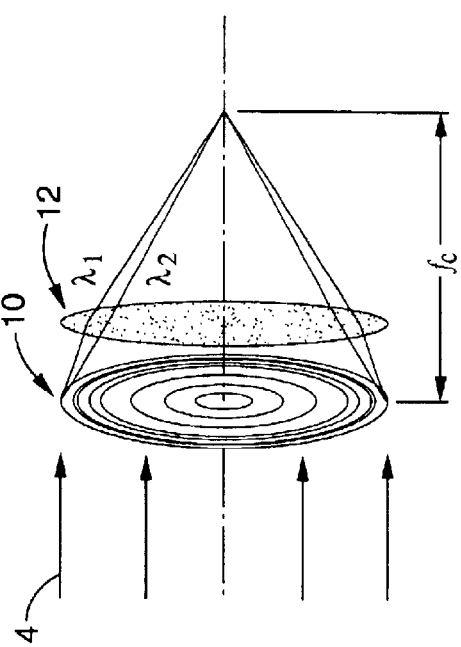
Figure 1A:
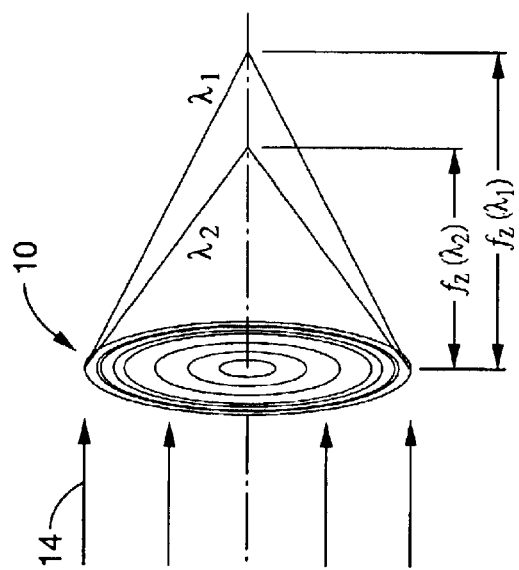

Referring now to FIG. 1, the basic principles of the present invention can be seen. FIG. 1 shows a Fresnel zone plate 10 and a refractive lens 12. FIG. 1 shows that the zone plate 10 and lens are subjected to radiation 14 (e.g., EUV and x-ray) having two wavelengths, $\lambda_1$ and $\lambda_2$, where $\lambda_1<\lambda_2$. As shown, the Fresnel zone plate focal length $f_z$ varies such that $f_z(\lambda_1)>f_z(\lambda_2)$. The present invention recognizes that it is possible to design a refractive Fresnel lens such that $f_r(\lambda_1)<f_r(\lambda_2)$, and to form a compound AFO comprising the Fresnel zone plate 10 with the refractive Fresnel lens 12, where the combined focal length $f_c$, is the same for both wavelengths and, in addition, wherein the focal length for all wavelengths between $\lambda_1$ and $\lambda_2$ fall within the depth of focus (DOF). For purposes of the discussion herein, we refer to the central wavelength $$\frac{\lambda_1 + \lambda_2}{2}$$

as the Designed Operating Wavelength (DOW). Accordingly, the present invention further recognizes that the optimal DOW of an AFO is near an absorption edge of an element making up the Fresnel lens because of the large wavelength dependence of $f_r$.

The principle behind the AFO of the present invention can be explained as follows. For a small wavelength increase, $\lambda \rightarrow \lambda+\Delta\lambda$, the focal length of a Fresnel zone plate is given by $$f_z(\lambda + \Delta\lambda) = \frac{f_z(\lambda)}{1 + \Delta\lambda/\lambda}.$$

For the refractive lens, both the wavelength variation $\lambda^2 \rightarrow \lambda^2+2\lambda\Delta\lambda+(\Delta\lambda)^2$ and the wavelength dependence in the effective number of electrons $f_1(\lambda)$ should be considered. Here, we use the lowest order term of the Taylor series expansion of $f_1(\lambda)$ as a good approximation; that is, $$f_1 \to f_1 + \frac{\Delta f_1}{\Delta \lambda} \Delta \lambda.$$

Keeping only first order variation terms, the focal length of the refractive lens can be expressed as $$f_r(\lambda + \Delta \lambda) = \frac{f_r(\lambda)}{1 + \frac{2\Delta\lambda}{\lambda} + \frac{\Delta f_1}{f_1}}. \quad (2)$$

If two lenses are separated by a small distance s, their combined focal length is given by $$\frac{1}{f_c} = \frac{1}{f_z} + \frac{1}{f_r} - \frac{s}{f_z f_r}. \quad (3)$$

In the limit $s \ll f_z f_r$, the focal length $f_c$, of the resulting compound optic made up of a Fresnel zone plate and a refractive lens is $$\frac{1}{f_c(\lambda + \Delta\lambda)} = \frac{1}{f_z(\lambda + \Delta\lambda)} + \frac{1}{f_r(\lambda + \Delta\lambda)} \quad (4)$$

$$= \frac{1}{f_z(\lambda)}\left(1 + \frac{\Delta\lambda}{\lambda}\right) + \frac{1}{f_r(\lambda)}\left(1 + \frac{2\Delta\lambda}{\lambda} + \frac{\Delta f_1}{f_1}\right)$$

$$= \frac{1}{f_z(\lambda)} + \frac{1}{f_r(\lambda)} + \frac{\Delta\lambda}{\lambda}\left[\frac{1}{f_z(\lambda)} + \frac{1}{f_r(\lambda)}\left(2 + \frac{\lambda}{f_1}\frac{\Delta f_1}{\Delta\lambda}\right)\right]$$

From the foregoing, the key to the achromatic Fresnel objective can be seen; namely, the term in the last bracket [ ] is made zero so that there is no change in focal length over a wavelength range $\Delta\lambda$. This condition can be written as $$\frac{f_r(\lambda)}{f_z(\lambda)} = -\left(2 + \frac{\Delta f_1 / f_1}{\Delta\lambda/\lambda}\right) = -(2 + D), \quad (5)$$

where $$D \equiv \frac{\Delta f_1 / f_1}{\Delta\lambda / \lambda}$$

characterizes the dispersion, or the dependence of the refractive lens on the wavelength. It follows that the radius of curvature of the refractive lens can be determined as $$R_C = 2\alpha R \Delta R \lambda f_1 (2+D). \quad (6)$$

A similar analysis can be carried out if the separation between the AFO's two components is not negligible.

Figure 2:
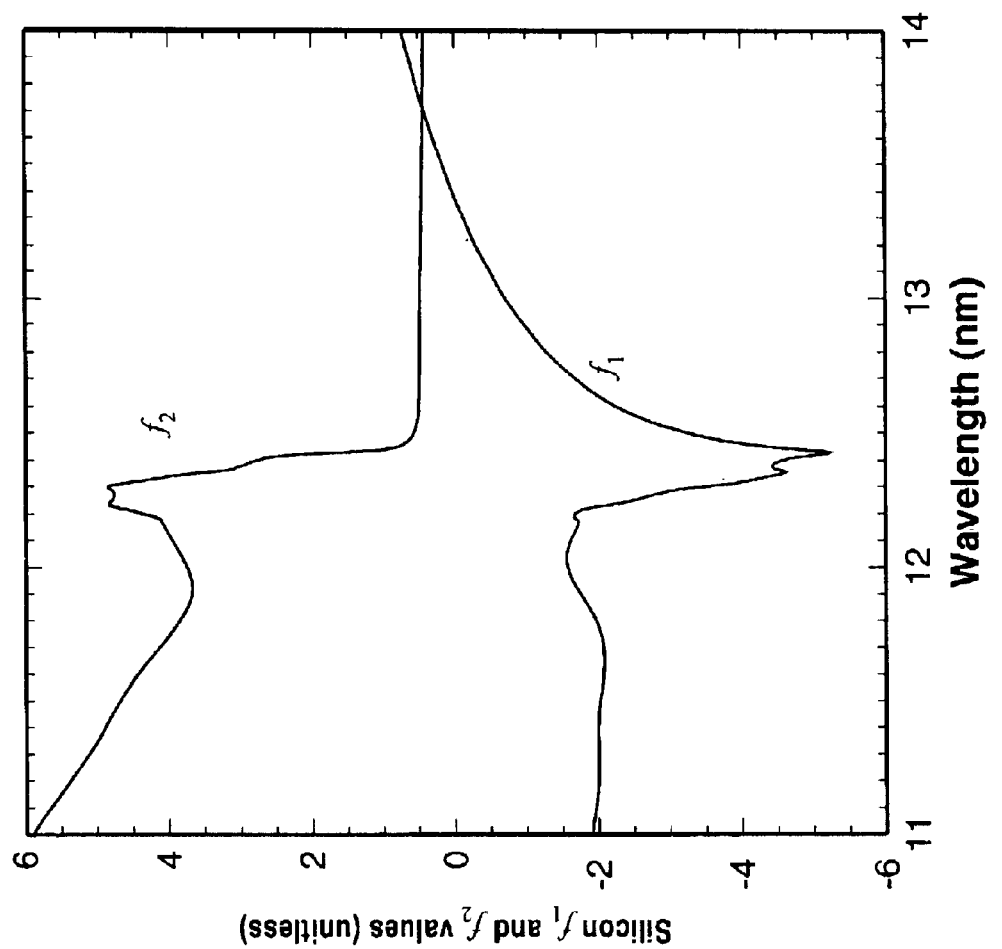
FIG. 2 is a graph of Silicon $f_1$ and $f_2$ values plotted versus radiation wavelength near the L-edge, illustrating the large change of $f_1$ as a function of wavelength near the absorption edge.

It will be appreciated that for the ease of fabrication of the refractive lens, it is advantageous to have a large radius of curvature, which requires a large dispersion. It is well known in anomalous dispersion theory that $f_1(\lambda)$ of a given material changes rapidly with wavelength near an absorption edge of a major element in the material. Therefore, for a given spectral range, it is preferred to make the refractive lens using a material containing an element having an absorption edge within the spectral range. In the case of a step-like rise in absorption as the wavelength is decreased (e.g., an EUV or x-ray absorption edge), $f_1(\lambda)$ has the shape of a "V" with the minimum of the dip occurring at wavelengths just above the wavelength of the absorption edge. The dependence of the refractive index near an absorption edge (also known as dispersion relation) is described by the Kramers-Kronig relation. FIG. 2 shows a plot of $f_1(\lambda)$ calculated using the Kramers-Kronig relation based on measured absorption data near the silicon L absorption edge. Within the "V" shaped spectral region, the value of D ranges from 50 to 100. In this spectral region, Equation (5) indicates that the focal length of the refractive lens is much larger than that of the Fresnel zone plate. Furthermore, Equation (6) can be approximated as:

$$R_C \approx 2\alpha R \Delta R \lambda f_1 (2+D) \quad (7)$$

$$= \alpha \times (2R\Delta R) \times \lambda^2 \times \frac{\Delta f_1}{\Delta \lambda}.$$

Here we see that the radius of curvature of the refractive lens depends on a constant $\alpha$, zone plate parameters R and $\Delta R$, designed operating wavelength $\lambda$, and the dispersion property $$\frac{\Delta f_1}{\Delta \lambda}$$

of the refractive lens material. It is generally preferable to use the long wavelength (lower in energy) part of the "V" spectral region because the absorption attenuation of the transmitted radiation is much lower than the corresponding short wavelength part. For material with absorption edges at much shorter wavelengths (less than 1 nm) where absorption is less of a concern, wavelengths above the absorption edge can be used. The required shape of the refractive lens is convex if the DOW is in longer than the wavelength corresponding to the minimum of $f_1(\lambda)$, and is concave if the DOW is shorter. Finally, since the focal length of the refractive lens 12 (FIG. 1) is much larger than the zone plate 10 (FIG. 1), the resolution and depth of field of the compound AFO are approximately equal to those of the Fresnel zone plate component.

Figure 3:
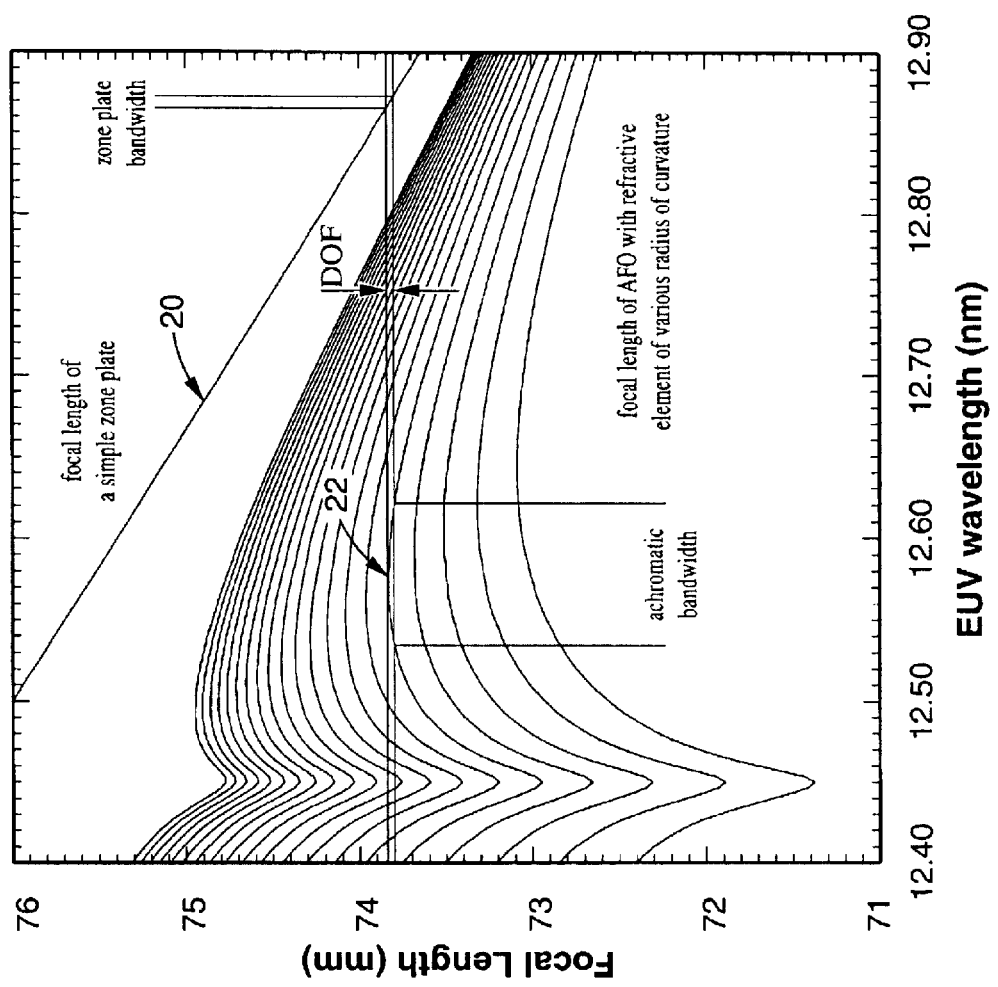
FIG. 3 is a graph comparing the focal length of a simple Fresnel zone plate and a compound AFO lens plotted as a function of radiation wavelength, illustrating that the dependence of the AFO's focal length on wavelength is substantially smaller than the Fresnel zone plate.

FIG. 3 shows the behavior of the combined focal length $f_c$ for an example of an AFO as a function of radiation wavelength compared to a simple zone plate. The wavelength dependence of $f_1$ is a key element to why the AFO of the present invention functions as described. Generally, $f_1$ varies slowly with wavelength and this rate of change is too small to be useful for chromatic correction. However, classical anomalous dispersion theory shows that $f_1$ varies quickly with wavelength near an absorption edge. When the wavelength of incident radiation decreases and approaches an absorption edge of an element making up the refractive Fresnel lens, the value of $f_1$ decreases rapidly and then increases rapidly (see FIG. 2). This occurs for elements of atomic number between 3–50 at wavelengths of approximately 1–20 nm. For silicon in the 12.6 to 13.5 nm wavelength region, the decrease in $f_1$ means that the focal length of a convex refractive Fresnel lens increases with wavelength, which is opposite to the wavelength dependence of the zone plate's focal length. Within the designed spectral bandwidth, the change in $f_r$ due to $f_1$ is significantly greater than that due to wavelength and is also much greater than the zone plate's focal length change. The relatively large dependence of $f_r$ on wavelength (large dispersion in optics terminology) not only permit its use for correcting the chromaticity of zone plate, but also makes its fabrication practical.

In FIG. 3, the upper straight line 20 shows that the focal length of the zone plate 10 is inversely proportional to the radiation wavelength. However, when combined with the refractive lens 12, as shown in FIG. 1, the straight line 20 can be bent so that within certain bandwidths, the combined focal length changes little (e.g., curved line 22), demonstrating that the AFO has much wider achromatic bandwidth than the Fresnel zone plate. It is to be understood that the two extreme or bandwidth-defining wavelengths can be selected such that $f_c$ for all wavelengths between them also falls within the depth of field. Moreover, because of the aforementioned difficulties associated with making refractive lenses, the Fresnel zone plate 10 is preferably the principal focusing element and the refractive lens 12 is preferably used to recombine the light of different wavelengths dispersed by the zone plate 10.

Figure 7:
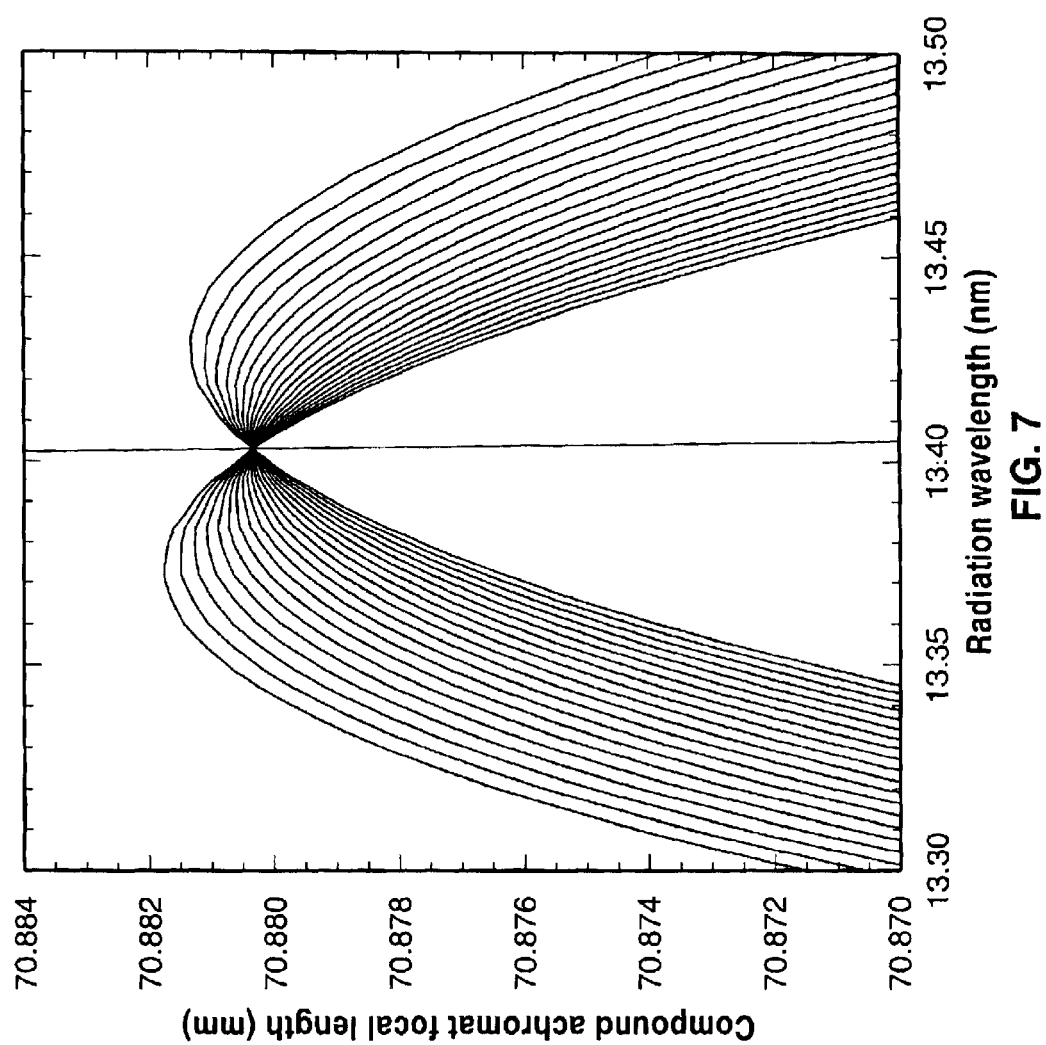
FIG. 7 is a graph of the combined focal length of an AFO according to the present invention having a silicon refractive lens plotted versus radiation wavelength.
Figure 8:
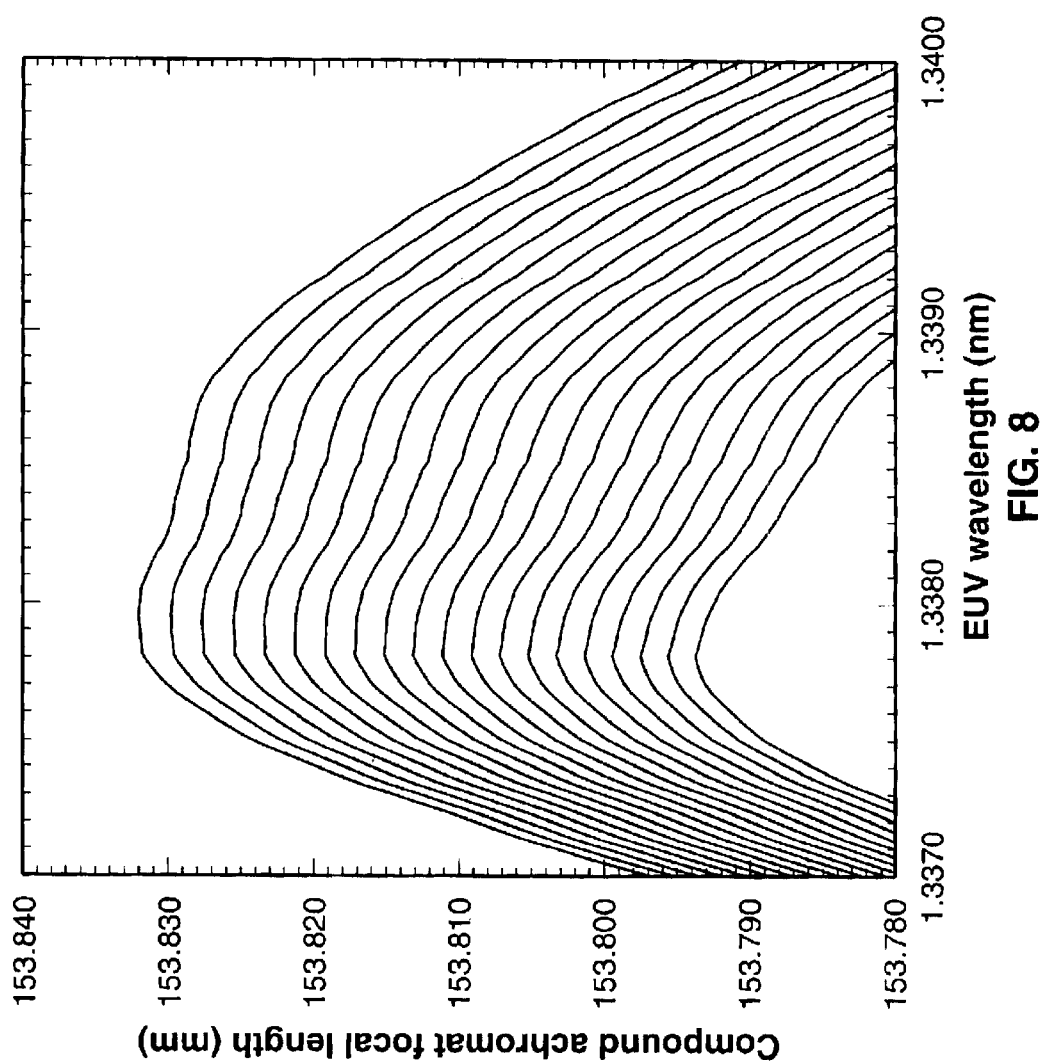
FIG. 8 is a graph of the combined focal length of an AFO according to the present invention having a copper refractive lens plotted versus radiation wavelength.

For example, an AFO with the desired optical parameters can be designed using suitable refractive Fresnel lens materials and appropriate geometry parameters. FIG. 7 shows the calculated focal length of an AFO as a function of wavelength for a silicon refractive lens. The focal length is contained in the depth of field of the lens, within ~1.2% spectral bandwidth near 13.4 nm. Note that the focal length of the zone plate is inversely proportional to wavelength, and the chromaticity correction is achieved by a refractive Fresnel lens made from Si which has an absorption edge near 13.4 nm. Similar parameters for an AFO with designed operation wavelength (DOW) near 1.3 nm using a copper refractive lens are shown in FIG. 8. This lens is clearly appropriate for x-ray lithography applications.

The degree of bending of radiation by the refractive lens depends on its radius of curvature. As shown in FIG. 3, the higher curves (closer to the simple zone plate) result from corrective refractive lenses with larger radius of curvature, or a weaker lens. As the radius is decreased (or as the refractive lens becomes stronger), the focal length of the compound lens deviates more from that of the simple zone plate and at the same time, the operating wavelength is shifted away from the absorption edge while the curve near the DOW becomes flatter, resulting in wider bandwidth. It is therefore recognized that the refractive lens has a strong influence on the DOW and the bandwidth. Consequently, its design must also take into account spectral characteristics of other components of the systems such as the source spectrum and condenser spectral response, etc. In practice, further considerations such as related fabrication technology and previous experience, etc. must also be included. For an example, much experience has been gained in EUV lithography programs for energies between ninety-five and one hundred electron volts (95 eV and 100 eV) and x-ray lithography programs for energies near one kilo electron volts (1 keV) energy. Sources, reflective optics, and monochromators are well developed for these energies. It is advantageous to leverage on these experiences and resources to develop the applications, discussed below, that uses the achromatic Fresnel lens of the present invention.

Another factor that must be considered when designing the AFO is the fabrication of the refractive lens in conjunction with the zone plate. Traditionally, zone plates have been fabricated on silicon substrates, much like microchips. Therefore, it is very convenient to use the same silicon substrate to fabricate the refractive lens thereon. Techniques for etching silicon with high accuracy have also been well developed. Material properties must also be considered. Silicon, chromium, and copper have all been used extensively for fabricating nanostructures and as such are the preferred materials for manufacturing the present invention.

A few non-limiting AFO design examples are listed in Table 1.

The maximum thickness tc of the refractive lens is:

$$t_C = R_C - \sqrt{R_C^2 - R^2} \approx \frac{R^2}{2R_C}. \tag{8}$$

Especially at EUV wavelengths, this thickness may be large enough to absorb an unacceptably large fraction of the incident intensity. One strategy for dealing with this issue is to replace the refractive lens with a refractive Fresnel lens so that the overall curvature can be maintained within a stepwise approximation while decreasing the refractive lens thickness to acceptable values.

Figure 5:
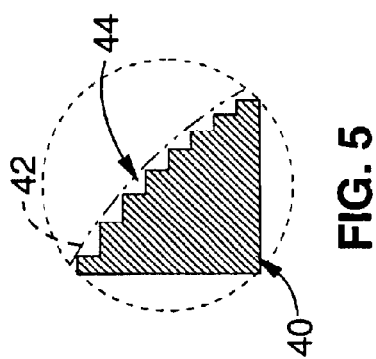
FIG. 5 is a detailed side view of a portion of the achromatic Fresnel optic of FIG. 4 showing a non-limiting example of a staircase profile that approximates the curved lens surface.
Figure 4:
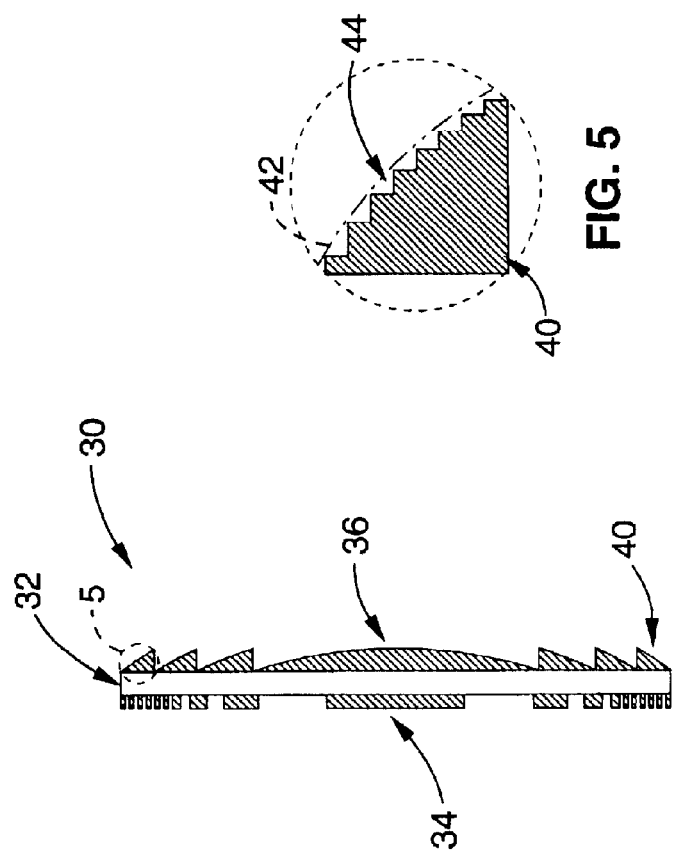
FIG. 4 is a side view of an achromatic Fresnel optic according to the present invention.

Referring now to FIG. 4 and FIG. 5, a preferred, non-limiting example of an AFO constructed from silicon is shown and generally designated 30. FIG. 4 shows that the AFO 30 includes a preferably silicon substrate 32 on which a silicon zone plate 34 and silicon refractive lens 36 are constructed. For example, a fine line width, binary grating structure 34 (i.e., a Fresnel zone plate) is fabricated on one side of a robust 0.25 micron thick silicon nitride window 32. On the other side of the same window, a series of three lithography steps can be used to pattern an eight-level Fresnel lens 36 that produces the desired refractive lens correction. It is important to realize that only one lithography step need be done at high resolution (the patterning of the Fresnel zone plate); the Fresnel lens, whose finest zones are of micron size, can be patterned at the resolution of existing optical steppers.

Figure 6:
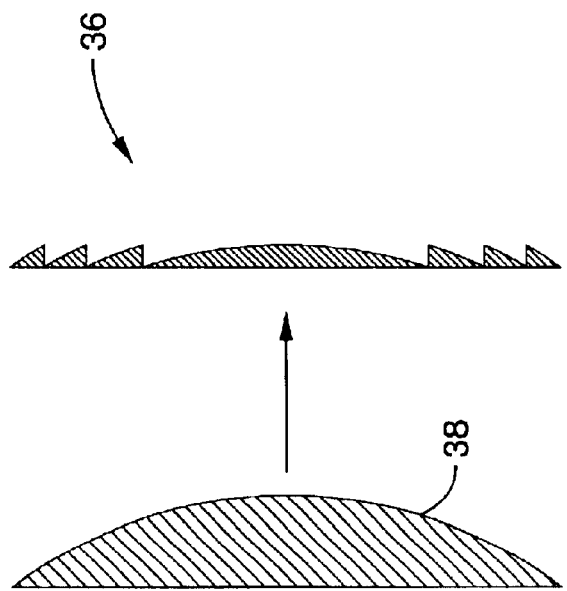
FIG. 6 is a side view of a simple refractive lens compared to a thinner refractive Fresnel lens of the type shown in FIG. 4.

It is to be understood that, since a simple refractive lens may be too thick for achieving acceptable transmission of short wavelength radiation, the preferred refractive lens 36 is a refractive Fresnel lens for improving the throughput of the AFO. For example referring to the leftmost portion of FIG. 6, a simple refractive lens 38 listed in the first row of Table 1 having a central thickness of 0.42 mm is too thick to use with EUV light having an 1/e absorption of 0.55 $\mu$m. As shown in the rightmost portion of FIG. 6, the solution is to produce a thinner refractive Fresnel lens 36, preferably on the same substrate as the zone plate 34 as shown in FIG. 4.

If the maximum thickness of the refractive Fresnel lens 36 is 1.25 $\mu$m, corresponding to 2Π phase at the DOW, approximately 20% average transmission can be achieved. Such a Fresnel lens has about three-hundred and forty bands 40. Much like a diffractive zone plate, the width of the bands are coarse near the center of the lens and finer near the edge. In the preferred design, the outermost band is about 7.4 $\mu$m, which can be produced with photo-induced chemical etching techniques. In practice, a smooth spherical shape is difficult to produce accurately, but the curvature 42 can be approximated by making a plurality of steps 44 in each band as shown in FIG. 5. With current nano-fabrication technology, zone plates with efficiency of 50% have been demonstrated. This yields a combined efficiency of about 10% for the achromatic lens. It is to be understood that the above construction method is preferred because large separation values, s, have the tendency of decreasing the bandwidth. Also, fabricating both elements on the same substrate makes it easier to align them and maintain that alignment. It is, however, also possible to construct both lens elements on separate substrates and align them later. This separate construction method may simplify the fabrication procedures at large-scale production beyond the prototype demonstration.

Note that the $2\pi$ phase shift depth is only exactly true for the DOW. At other wavelengths within the bandwidth, a small wavefront error of 0.01λ to 0.1λ will occur. However, the degradation to the performance of the lens from this error may be negligible for most applications.

To further improve the throughput of the compound optic, the maximum thickness of the Fresnel lens can be made thinner to arbitrary thickness while the phase error introduced can be canceled by adjusting the zone positions of the Fresnel zone plate. As a non-limiting example, we may choose the make the maximum thickness of the Fresnel lens to be 0.625 $\mu$m, corresponding to Tr phase shift. Then the rays from neighboring bands will arrive at the focal point out of phase and therefore fail to focus. We can shift the position of the zones (rings) of the zone plate that lie within alternate bands by one zone (half the zone/space period).

Consequently, an additional Π phase shift is produced by the zone plate, canceling the Π generated by the refractive lens. This example would have about combined efficiency of about 25%, more than doubling the previous one with maximum thickness corresponding to 2Π phase shift. It is noted that this method is practical since the zone plate is most often patterned by an electron beam writer typically with a much higher positioning accuracy than the zone width.

For electromagnetic radiation of wavelength loner than about 1 nm, the $f_1$ value of many elements crosses zero during its pre-edge decline (see FIG. 2). If the DOW is designed to be the zero-crossing point, the refractive Fresnel lens can be of arbitrary thickness, while requiring no additional compensation from the zone plate. In this case, the Fresnel lens acts as an absorber and a wavelength (counter) disperser: for radiation exactly at the DOW, no phase shift is produced. While radiation at other wavelengths within the bandwidth will be dispersed according to design to converge at the focal point, no net phase shift is produced. This is the preferred regime to construct an achromat according to the methods discussed above.

The size of the zone plate and imaging field are likely to be limited by the primary aberrations. When imaging finite conjugates with object distance p and image distance q for off-axis angle of θ, the Seidel wavefront (primary) aberrations are:

$$\text{spherical aberration:} \quad \frac{3r^4(q-f)}{8f^2q^2} \qquad (9)$$

$$\text{coma:} \quad \leq \frac{\theta r^3}{2}\left(\frac{1}{q^2} - \frac{1}{p^2}\right) \qquad (10)$$

$$\text{astigmatism} \quad -\frac{r^2\theta^2}{2f} \qquad (11)$$

$$\text{field curvature:} \quad -\frac{r^2\theta^2}{4f} \qquad (12)$$

The distortion term is always zero, i.e. a Fresnel zone plate always produces distortion-free images. To obtain diffraction-limited images, these terms should be kept under λ/4.

As a non-limiting example, we first look at the maximum zone plate size and image field size attainable for an AFO without any monochromatic aberration correction for 4:1 demagnifying imaging. At DOW of 1.33 nm, the AFOs in Table 1 have outer most zone width of between 41 nm and 95 nm, hence the numerical apertures are quite small, ranging from 0.032 to 0.014. Imaging fields between 2 mm and 15 mm can be obtained. When used with EUV radiation at 12.5 nm wavelength, the numerical apertures are increased nearly ten fold. The primary aberrations become problematic when the zone plate consists of more than a few hundred zones. For an example, for a zone plate with 95 nm outer zone width, diffraction limited images can be obtained if the zone plate has a diameter of less than 0.5 mm and an imaging field of 0.15 mm. This can be increased significantly if aberration corrections are applied. A well-known technique used in designing refractive lenses for visible light regime is to adjust the bending factor defined as $$B = \frac{R_2 + R_1}{R_2 - R_1} \qquad (13)$$

where $R_1$ and $R_2$ are the lens radii of curvature. A zone plate can be interpreted as a hologram produced by a reference wave originating from distance $R_{Ref}$ and a point object from distance $R_{Obj}$. The bending factor for a zone plate can then be similarly defined as $$B = \frac{R_{Ref} - R_{Obj}}{R_{Ref} - R_{Obj}}. \qquad (14)$$

It has been shown that by adjusting the value of B, all primary aberrations of a zone plate can be simultaneously minimized. For an example, by computing zones for specific finite conjugate imaging, spherical aberration can be eliminated completely at the designed conjugates. (It will, however, appear at other conjugates.) In accordance with the present invention, we exploit this property to correct the aberrations of an AFO; namely, the astigmatism and field curvature can be reduced by increasing the size of the AFO while maintaining the same of the field of view. Coma can be reduced or eliminated by placing a field aperture near or at the natural position. The distortion term is zero. That is, a zone plate, and therefore an AFO, produces distortion-free images.

Referring to FIG. 7, the focal length of the AFO 30 listed in the fourth row of Table 1 is shown as a function of energy for various refractive lens radius of curvature. From the graph, it can be observed that the if the radius of curvature is 6 mm, a bandwidth of 1.2 eV or 1.3% can be achieved. Note in the figure that the near-vertical line at the center of the graph is the zone plate focal length. It is to be understood that the tolerance for manufacturing can be quite high. The primarily effect of a small deviation from the designed radius of curvature is a shift in the DOW, it has a very small effect on other performances, such as bandwidth or throughput. In this example, a 10 μm or 0.17% error in the radius of curvature results in 0.003 nm or 0.023% shift in the operating wavelength.

When higher resolution than that discussed above is required for a large imaging field (e.g., lithographically printing 30 nm to 40 nm nodes), the EUV radiation's relative large wavelength requires a large numerical aperture (e.g., NA of approximately 0.25) lens, which demands very elaborate aberration corrections and severely reduces depth of field (0.2 μm). It is appreciated that shorter wavelength radiation is preferred because simpler aberration corrections may be adequate. For example, radiation of ~1 keV energy, which are used in proximity x-ray lithography, can be used in a lithography system using an AFO as the objective lens. In this case, the refractive lens 36 can be fabricated from copper (L-edge) or sodium based crystalline salt (sodium K-edge). FIG. 8 shows the focal length, $f_c$, of the AFO 30 (FIG. 4) with a 25 mm diameter, a 95 nm outer zone width, and a copper refractive element as a function of energy. If the refractive element has a radius of curvature of 500 mm, an achromatic bandwidth of 1 eV or 0.1% can be obtained. An equivalent Fresnel lens with a 0.5 μm thickness would have an outer zone width of 20 μm. The relatively narrow bandwidth results from the narrow L-absorption of copper. If alternatively a wider K-absorption edge of sodium is used, the bandwidth can be increased to three electron volts (3 eV), or three tenth of a percent (0.3%). It is recognized that if wider bandwidth is desired, an additional refractive lens can also be added to correct the chromatic aberration at three wavelengths, thus forming an apochromatic lens.

Current nano-fabrication technology can produce zone plates with an outer zone width small as approximately 20 nm. Therefore, AFOs of much higher resolution than the above examples can be produced. Example parameters are listed in Table 1. All the parameters listed in Table 1 are well within the limit of current fabrication technology and can be readily utilized to produce 20 nm structures in lithography applications.

It will be appreciated that if a concave refractive lens can be used in conjunction with the zone plate in the same scheme as described above to greatly enhance the chromaticity of the zone plate. The result is a focus element with high resolution in both spatial and energy domains. Also, note that the zone plate is not limited to a circular configuration as described. While the zone plate will focus in two dimensions if it is circular, a linear zone plate can be used if it is only necessary to focus in one dimension.

From the foregoing it will be appreciated that various lens configurations are possible. For example, by adding another downstream lens to expand bandwidth, it is possible to correct for three λ's. In other words, increasing the number of downstream refractive lenses (e.g., Fresnel lenses) will expand bandwidth. Similarly, additional diffractive lenses could be added upstream.

Based on the foregoing, it will be appreciated that the AFO of the present invention can be used in lithography applications. Key parameters characterizing the performance of the lithography apparatus of the present invention include the minimum printable feature size, which is directly related to the resolution, printing field size, depth of field, and system throughput. The imaging lens, illumination, and mask type, e.g., attenuation or phase mask, determines the resolution. For a phase mask under illumination of suitable degree of coherence, the resolution (RES), and depth of field (DOF), of an AFO are similar to those of a lens and can be expressed as:

$$RES = k_1 \frac{\lambda}{NA}$$

$$DOF = k_2 \frac{\lambda}{NA^2}$$

where NA is the numerical aperture of the AFO and λ is the wavelength of radiation used for imaging. These expressions show that the resolution can be increased by reducing λ and increasing NA. However, as the DOF is reduced, it can lead to stringent requirements in the wafer flatness and resist thickness and lead to difficulties in manufacturing. The parameters $k_1$ and $k_2$ are empirically determined and correspond to those values that yield the desired critical dimension (CD) control within an acceptable integrated circuit (IC) manufacturing process window. Values for $k_1$ and $k_2$ of 0.6 and greater have been used in high volume manufacturing. However, a given lithographic technology can be extended to finer resolution by using smaller values for $k_1$ and optimizing the IC fabrication process at the cost of tighter process control. Setting $k_1$ and $k_2$ equal to 0.5 corresponds to the Rayleigh criteria for resolution and DOF, while the theoretical limit for $k_1$ is 0.25 with incoherent illumination.

Table 2 and Table 3 list DOF and NA values as a function of wavelength and resolution. The thirteen and four-tenths nanometer (13.4 nm) wavelength is chosen because it is considered as the wavelength of choice for EUVL. Table 2 shows that a projection camera with a NA of twenty-seven one-hundredths (0.27) is required to print thirty nanometer (30 nm) features using thirteen and four-tenths nanometer (13.4 nm) radiation and the required NA decreases by ten (10) times for one and thirty-three hundredths nanometer (1.33 nm) radiation. Table 4 shows that for thirteen and four-tenths nanometers (13.4 nm), the DOF decreases to a small value of about five one-hundredths micrometers (0.05 μm) and could make manufacturing of twenty nanometer (20 nm) resolution lithography very difficult. Tables 2 and 3 also show that the depth of focus increases with decreasing wavelength. For example, the depth of focus for twenty nanometers (20 nm) resolution is fifteen one-hundredths micrometers (0.15 μm) and five-tenths micrometers (0.5 μm) for four and four-tenths nanometers (4.4 nm) and one and thirty-three hundredths nanometer (1.33 nm) radiations, respectively. Table 1 also lists the numerical aperture required for achieving a specific resolution and also the corresponding outermost zone width required for achieving the required numerical aperture for a zone plate optic.

Figure 9:
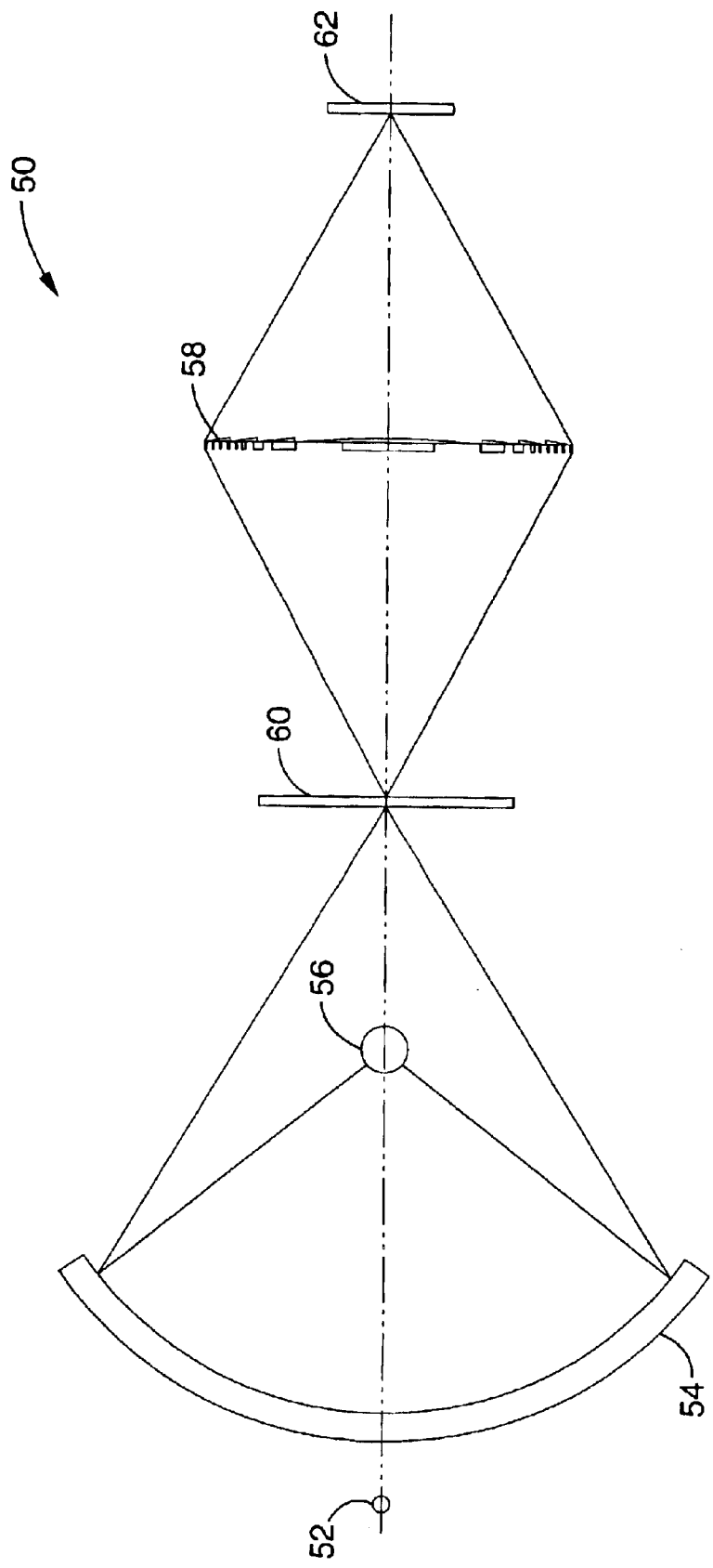
FIG. 9 is a schematic diagram of a lithography apparatus using an AFO of the present invention as an objective lens.

Referring now to FIG. 9, a lithography apparatus is shown and generally designated 50. FIG. 9 shows that the lithography apparatus 50 defines a longitudinal axis 52 and includes a condenser 54 (e.g., a reflective condenser as shown or a transmissive AFO condenser). A radiation source 56 is placed on the axis 52 at a predetermined distance from the condenser 54 and emits radiation that is reflected by the condenser 54. As shown, an AFO 58 is also placed along the axis 52 at a predetermined distance from the condenser 54 so that the source 56 is between the condenser 54 and the AFO 58. Also, a mask 60 is placed along the axis 52 between the source 56 and the AFO 58. As further shown in FIG. 9, a wafer 62 is placed along the axis 52 adjacent to the AFO 58 and opposite the mask 60. It is to be understood that the longitudinal axis 52 passes through the center of each component of the lithography apparatus 50.

By way of example, and not of limitation, and in accordance with the present invention, the mask 60 includes a pattern (not shown) that can be printed on the wafer 62. The source 56 emits a beam that includes the DOW of the AFO. Preferably, the beam is conditioned by a beam conditioning optic (e.g., the condenser 54). Then, the mask 60 is illuminated by the beam and the pattern in the illuminated area is imaged onto a suitable resist layer (not shown) on the wafer 62 by the AFO 58. It is to be understood that image can be demagnified (e.g., by the currently industry standard of 4:1, if necessary) by the AFO 58. The latent image on the resist layer is subsequently processed using established methods in order to produce the desired design structures on the wafer 62. It can be appreciated that the entire pattern on the mask 60 can be printed on the wafer 62 by a step-and-scan method well known in the art.

It is to be understood that the source 56 and the condenser 54 form the illumination system that provides proper mask illumination. The source 56 provides suitable in-band energy (defined as the integrated energy within a given bandwidth for a specific application) at the wavelength selected for a particular AFOL system design. In an exemplary lithography apparatus 50, the source can be a laser produced plasma source, a synchrotron source, or a discharge-capillary source. Other methods for producing one nanometer to thirteen nanometer (1 nm to 13 nm) short wavelength radiations include z-pinch plasmas, discharge-pumped x-ray lasers, and electron beam bombardment devices. The mask 60 contains the pattern designed after imaging projection by the AFO 58 to produce the desired latent image on the wafer 62, which is subsequently processed using established procedures to produce the desire structure on the wafer.

As intended by the present invention, the source 56 can emit radiation of different energies. Table 4 shows performance parameters of the Fresnel zone plate for a few exemplary energy values. Also, it is to be understood that the different components of the AFO 58 (i.e., the Fresnel zone plate and the refractive Fresnel lens) can be made from different materials depending on the wavelengths of radiation emitted by the source 56. Table 5 shows non-limiting examples of materials that can be used for the zone plate and the refractive Fresnel lens 12. These materials have a large dispersion for the ease of fabrication.

In a preferred embodiment, the resist layer (not shown) on the wafer 62 is made from polymethylmethacrylate (PMMA) or other high-resolution photoresist. It is to be understood that the thickness of the resist layer can be altered for radiation having different wavelengths. Table 6 shows different thicknesses of the resist layer for different wavelengths and energies for fifty percent (50%) transmission. The exemplary resist layers shown are compatible with EUVL resists for radiation having a wavelength of thirteen nanometers (13 nm). Moreover, they are compatible with resists developed for proximity x-ray lithography using radiation having wavelengths about one and three-tenth nanometers (1.3 nm). Also, the exemplary resists overcome the thin resist processing requirement for ten to thirteen nanometer (10 nm to 13 nm) EUV radiation when shorter wavelengths are used.

It is to be understood that the AFO 58 (FIG. 9) can be designed to eliminate the chromatic aberration for a narrow wavelength band near some discrete short wavelength electromagnetic radiations by selecting suitable materials for constructing the Fresnel lens and appropriate geometric parameters using the disclosed the procedures disclosed in this invention. A properly designed AFO 58 (FIG. 9) can have a field of view of many square millimeters and a 25 nm spatial resolution or better, making it useful as a transmission objective in a next generation lithography tool. Wavelengths suitable for lithography include the approximately 0.6 nm to 13 nm spectrum, the spectrum between the EUVL and the proximity x-ray lithography.

Table 7 shows exemplary design parameters for a lithography apparatus 50 having a seventy nanometer (70 nm) node, a fifty nanometer (50 nm) node, and a thirty nanometer (30 nm) node. As shown in Tables 9–11, as the wavelength decreases for each node size, the working distance increases and the depth of focus increases.

It is to be understood that the lithography apparatus 50 (FIG. 9) can be realized in a variety of configurations including, but not limited to the four embodiments described herein which employ one or more AFOs 58 to image the mask 60 onto the wafer 62 and function as the projection optic in a standard current lithography tool. In addition to the AFO 58, they all include a suitable illumination source 56 providing sufficient flux within the bandwidth of the AFO 58, a condenser 54 providing suitable illumination, a mask 60 that contains suitable structures for printing the designed structure, and a mechanical wafer carrier (not shown). Each embodiment can be configured to demagnify the mask structure onto the wafer 62. It is to be understood that two of the three configurations of the lithography apparatus 50 utilize transmissive masks that include a patterned structure supported on thin membranes. The patterned structure is designed to modify the transmitted radiation by attenuation or phase shifting to achieve an emerging wave front with predetermined properties.

Figure 10:
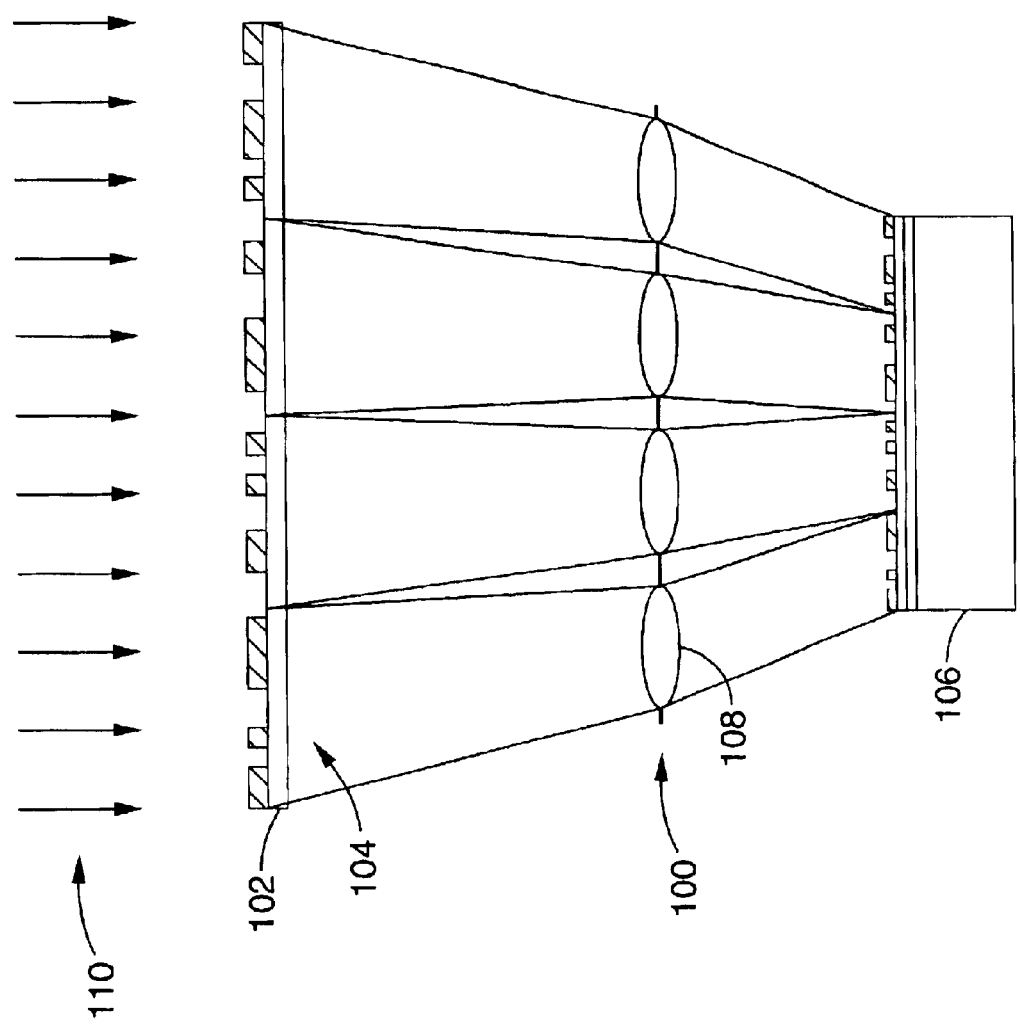
FIG. 10 is a schematic diagram of a lithography apparatus using an array of AFOs of the present invention with a transmissive mask.

For example, in a first embodiment as shown in FIG. 9 the condenser 54 is a multilayer spherical mirror operating in the back reflection geometry. This design is suited for wavelengths from approximately four nanometers to thirteen nanometers (~4–13 nm). In a second embodiment, the condenser 54 is a multilayer mirror operating at incidence angle significantly larger than ten degrees (10°) and is better suited for wavelengths less than four nanometers (4 nm). A third embodiment utilizes a reflective mask that includes a patterned structure on a multilayer substrate that acts as a mirror. Such a mask is similar to mask used in EUVL. A fourth embodiment as shown in FIG. 10 uses an array 100 of AFOs instead of a single AFO in the previous two designs.

In this configuration, the mask area 102 is divided into a number of sections 104, each of which is imaged to the wafer 106 by an individual AFO 108 in parallel. This design has the potential to simplify the optics fabrication by allowing a large area to be imaged by an array of small AFOs instead of single large one. The source of illumination 110 for this embodiment is not explicitly drawn in the figure. It can be provided by a number of means including, but not limited to, a single large condenser, an array of condensers, or an array of field emitter type radiation sources. Additionally, while FIG. 10 shows an lithography apparatus with a transmissive mask, the mask can be of either transmissive or reflective type. The use of a field emitter type radiation source also provides the possibility for a masklless lithography system, in which the field emitters are switched on and off as the wafer is scanned to produce the desired exposure pattern on the wafer.

Figure 11:
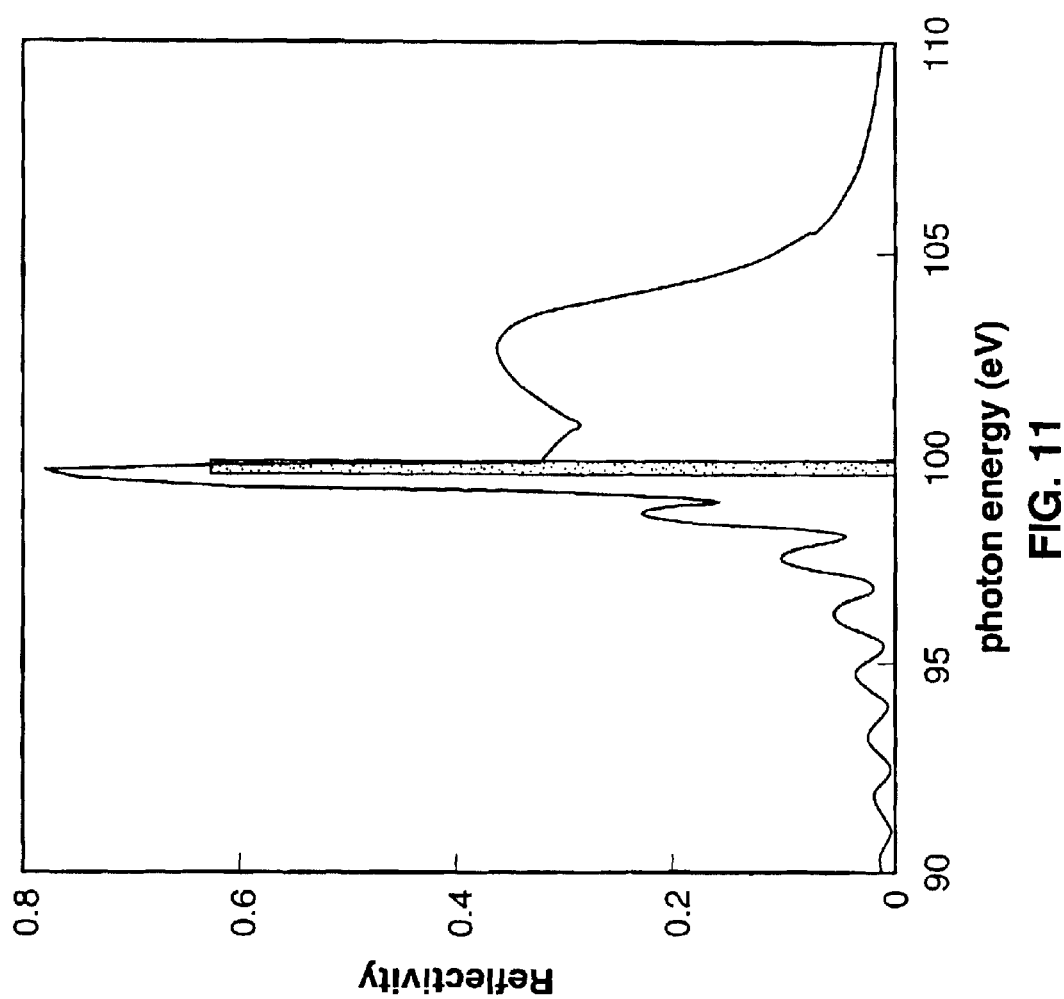
FIG. 11 is a graph of reflectivity of a single multi-layer condenser plotted as a function of photon energy.

FIG. 11 shows a graph of reflectivity of a single multi-layer condenser plotted as a function of photon energy (eV). As shown, at approximately one-hundred electron volts (100 eV) approximately seventy percent efficiency (70%) can be achieved. It is to be understood that this is approximately two times greater throughput than a three reflector EUVL configuration. It is also to be understood that the multi-layer reflector spectrally filters the source energy and the spectrum above one-hundred electron volts (100 eV) is also filtered by silicon absorption in the transmission optic.

Figure 12:
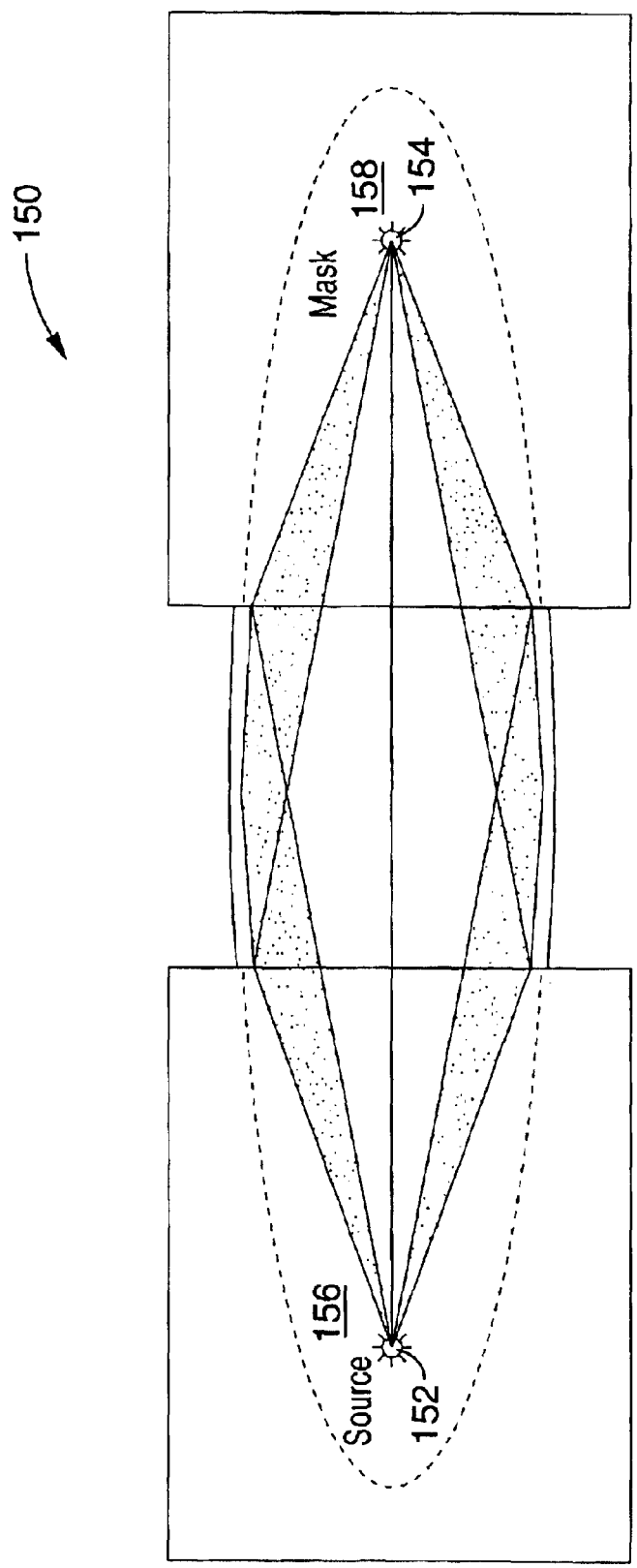
FIG. 12 is a schematic diagram of a multi-layer elliptical mirror condenser in accordance with the present invention.

FIG. 12 illustrates a multi-layer elliptical mirror condenser, generally designated 150. The condenser 150 shown in FIG. 12 is part of an ellipse coated with an appropriate multilayer. As shown, the condenser 150 includes a first focal point 152 and a second focal point 154. FIG. 12 shows that the first focal point 152 is located adjacent a source 156 and the second focal point 154 is located adjacent a mask 158. This condenser can also be incorporated into the lithography apparatus 50 (FIG. 9).

Although the description above contains many specificities, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

Examples of achromatic Fresnel lens parameters

| DOW (nm) | refractive lens material | diameter (mm) | imaging field mm | zone plate outer zone width (nm) | focal length (mm) | depth of field (μm) | bandwidth (%) | efficiency (%) | node size (phase mask) (nm) | Rayleigh resolution (nm) |
|---|---|---|---|---|---|---|---|---|---|---|
| 12.57 | silicon | 10 | 5 | 95 | 76 | 2.9 | 0.3 | 10 | 70 | 115 |
| 12.57 | silicon | 6 | 3 | 70 | 33 | 1.6 | 0.4 | 10 | 50 | 85 |
| 12.57 | silicon | 6 | 3 | 41 | 20 | 0.5 | 0.25 | 10 | 30 | 50 |
| 13.38 | silicon | 10 | 5 | 95 | 71 | 2.9 | 1.2 | 40 | 70 | 115 |
| 13.38 | silicon | 6 | 3 | 70 | 31 | 1.6 | 1.2 | 40 | 50 | 85 |
| 13.38 | silicon | 6 | 3 | 41 | 18 | 0.5 | 1.2 | 40 | 30 | 50 |
| 1.34 | copper | 25 | 15 | 95 | 1773 | 27.0 | 0.1 | 10 | 70 | 115 |
| 1.34 | copper | 18 | 8 | 70 | 941 | 14.6 | 0.1 | 10 | 50 | 85 |
| 1.34 | copper | 5 | 2 | 41 | 153 | 5.0 | 0.15 | 10 | 30 | 50 |
| 1.16 | sodium | 25 | 15 | 95 | 2050 | 36.2 | 0.3 | 40 | 70 | 115 |
| 1.16 | sodium | 18 | 8 | 70 | 1085 | 19.6 | 0.3 | 40 | 50 | 85 |
| 1.16 | sodium | 5 | 2 | 41 | 176 | 6.7 | 0.3 | 40 | 30 | 50 |

TABLE 2

NA as a function of node size and wavelength

| | Wavelength (nm) | | |
|---|---|---|---|
| Resolution (nm) | 13.4 | 4.4 | 1.33 |
| 80 | 0.1 | 0.033 | 0.01 |
| 60 | 0.13 | 0.044 | 0.013 |
| 40 | 0.20 | 0.066 | 0.02 |
| 30 | 0.27 | 0.088 | 0.027 |
| 20 | 0.40 | 0.13 | 0.04 |

TABLE 3

Depth of field (micrometers) as a function of node size and wavelength

| | Wavelength (nm) | | |
|---|---|---|---|
| Resolution (nm) | 13.4 | 4.4 | 1.33 |
| 80 | 0.8 | 2.4 | 8.0 |
| 60 | 0.45 | 1.4 | 4.5 |
| 40 | 0.20 | 0.6 | 2.0 |
| 30 | 0.12 | 0.34 | 1.1 |
| 20 | 0.05 | 0.15 | 0.5 |

TABLE 4

Demonstrated Performance Parameters of Zone Plate for Short Wave Radiations

| Energy (eV) | Resolution* (nm) | Efficiency (%) | Diameter (μm) | Material |
|---|---|---|---|---|
| ~500 | 26 | 20 | 60 | Ni |
| ~500 | 45 | 10 | 9000 | Ni |
| ~4–7000 | 80 | 10 | 100 | Au |

*Resolution for amplitude contrast

TABLE 5

Exemplary, non-limiting material parameters for the Zone Plate Component of an AFO

| γ (nm) | E (eV) | Material | Tπ (nm) | η (%)* |
|---|---|---|---|---|
| 12.5 | 99.7 | Mo | 90 | 32 |
| 11.1 | 111.6 | Mo | 200 | 23 |
| | | Pd | 180 | 23 |
| 6.6 | 187.9 | InN | 200 | 28 |
| | | In | 200 | 26 |

*Efficiency of zone plate with a simple square-wave zone profile (a factor of 2 increase is possible with a blazed profile)

TABLE 6

Exemplary, non-limiting PMMA thicknesses for 50% transmission

| Wavelength (nm) | 12.5 | 6.6 | 4.4 | 2.16 | 1.33 | 0.23 |
|---|---|---|---|---|---|---|
| Energy (eV) | 99 | 187 | 282 | 573 | 930 | 5414 |
| Thickness (μm) | 0.16 | 0.6 | 1.9 | 0.5 | 1.7 | 280 |

TABLE 7

Exemplary, non-limiting AFOL Design Parameters for Various Node Sizes

| node size (nm) | wavelength (nm) | writing field (mm) | working distance (mm) | depth of field (μm) |
|---|---|---|---|---|
| 70 | 12.5 | 25 | 95 | 1.5 |
| | 6.6 | 25 | 179 | 2.7 |
| | 1.33 | 25 | 897 | 13.6 |
| 50 | 12.5 | 9 | 42 | 0.8 |
| | 6.6 | 9 | 79 | 1.5 |
| | 1.33 | 9 | 396 | 7.4 |
| 30 | 12.5 | 9 | 24.5 | 0.25 |
| | 6.6 | 9 | 46.4 | 0.5 |
| | 1.33 | 9 | 232 | 2.6 |

Compatible for image reduction of four (4).

What is claimed is:

1. In a lithography apparatus, the improvement comprising:

an achromatic Fresnel objective configured for focusing radiation passing through a mask onto a wafer;

wherein said achromatic Fresnel objective comprises;
a diffractive lens comprising a Fresnel zone plate; and
a refractive lens comprising a Fresnel lens;
said diffractive lens and said refractive lens formed on opposite sides of a common substrate and configured to cancel chromatic aberration in said lenses.

2. A lithography apparatus, comprising:
at least one condenser; and
at least one achromatic Fresnel objective;
wherein at least one said achromatic Fresnel objective comprises a Fresnel zone plate and a refractive Fresnel lens on opposite sides of a common substrate.

3. A lithography apparatus as recited in claim 2, wherein at least one said condenser comprises a multi-layer mirror.

4. A lithography apparatus as recited in claim 3, wherein at least one said multi-layer mirror comprises a multi-layer spherical mirror.

5. A lithography apparatus as recited in claim 3, wherein at least one said multi-layer mirror comprises a multi-layer elliptical mirror.

6. A lithography apparatus as recited in claim 2, wherein at least one said condenser comprises an achromatic Fresnel objective.

7. A lithography apparatus as recited in claim 2, further comprising at least one radiation source positioned upstream of the condenser.

8. A lithography apparatus as recited in claim 7, wherein at least one said radiation source is selected from the group consisting essentially of a laser-plasma source, a synchrotron source, a discharge-capillary source, a z-pinch plasma source, a discharge-pump x-ray laser source, and an electron bombardment source.

9. A lithography apparatus, comprising:
at least one condenser;
a Fresnel zone plate; and
a refractive Fresnel lens;
wherein said Fresnel zone plate and said refractive Fresnel lens are formed on opposite sides of a common substrate; and
wherein said Fresnel zone plate and said refractive Fresnel lens form an achromatic Fresnel objective.

10. A lithography apparatus as recited in claim 9, wherein at least one said condenser comprises a multi-layer mirror.

11. A lithography apparatus as recited in claim 10, wherein at least one said multi-layer mirror comprises a multi-layer spherical mirror.

12. A lithography apparatus as recited in claim 10, wherein at least one said multi-layer mirror comprises a multi-layer elliptical mirror.

13. A lithography apparatus as recited in claim 9, wherein at least one said condenser comprises an achromatic Fresnel objective.

14. A lithography apparatus as recited in claim 9, further comprising at least one radiation source positioned upstream of the condenser.

15. A lithography apparatus as recited in claim 14, wherein at least one said radiation source is selected from the group consisting essentially of a laser-plasma source, a synchrotron source, a discharge-capillary source, a z-pinch plasma source, a discharge-pump x-ray laser source, and an electron bombardment source.

16. A lithography apparatus, comprising:
at least one condenser;
at least one achromatic Fresnel objective; and
at least one radiation source positioned upstream of the condenser;
wherein at least one said achromatic Fresnel objective comprises a Fresnel zone plate and a refractive Fresnel lens on opposite sides of a common substrate.

17. A lithography apparatus as recited in claim 16, wherein at least one said condenser comprises a multi-layer mirror.

18. A lithography apparatus as recited in claim 17, wherein at least one said multi-layer mirror comprises a multi-layer spherical mirror.

19. A lithography apparatus as recited in claim 17, wherein at least one said multi-layer mirror comprises a multi-layer elliptical mirror.

20. A lithography apparatus as recited in claim 16, wherein at least one said condenser comprises an achromatic Fresnel objective.

21. A lithography apparatus as recited in claim 16, wherein at least one said radiation source is selected from the group consisting essentially of a laser-plasma source, a synchrotron source, a discharge-capillary source, a z-pinch plasma source, a discharge-pump x-ray laser source, and an electron bombardment source.

22. A lithography apparatus, comprising:
at least one multi-layer mirror condenser;
at least one achromatic Fresnel objective; and
at least one radiation source positioned upstream of the condenser;
wherein at least one said achromatic Fresnel objective comprises a Fresnel zone plate and a refractive Fresnel lens on opposite sides of a common substrate.

23. A lithography apparatus as recited in claim 22, wherein at least one said multi-layer mirror condenser comprises a multi-layer spherical mirror condenser.

24. A lithography apparatus as recited in claim 22, wherein at least one said multi-layer mirror condenser comprises a multi-layer elliptical mirror condenser.

25. A lithography apparatus as recited in claim 22, wherein at least one said radiation source is selected from the group consisting essentially of a laser-plasma source, a synchrotron source, a discharge-capillary source, a z-pinch plasma source, a discharge-pump x-ray laser source, and an electron bombardment source.

26. A lithography apparatus, comprising:
at least one multi-layer mirror condenser;
at least one achromatic Fresnel objective;
at least one reflective mask positioned optically between the condenser and the achromatic lens; and
at least one radiation source positioned upstream of the condenser;
wherein at least one said achromatic Fresnel objective comprises a Fresnel zone plate and a refractive Fresnel lens on opposite sides of a common substrate.

27. A lithography apparatus as recited in claim 26, wherein at least one said multi-layer mirror condenser comprises a multi-layer spherical mirror condenser.

28. A lithography apparatus as recited in claim 26, wherein at least one said multi-layer mirror condenser comprises a multi-layer elliptical mirror condenser.

29. A lithography apparatus as recited in claim 26, wherein at least one said radiation source is selected from the group consisting essentially of a laser-plasma source, a synchrotron source, a discharge-capillary source, a z-pinch plasma source, a discharge-pump x-ray laser source, and an electron bombardment source.

30. A lithography apparatus, comprising:
at least one multi-layer mirror condenser;
at least one achromatic Fresnel objective;
at least one transmissive mask positioned optically between the condenser and the achromatic lens; and
at least one radiation source positioned upstream of the condenser;

wherein at least one said achromatic Fresnel objective comprises a Fresnel zone plate and a refractive Fresnel lens on opposite sides of a common substrate.

31. A lithography apparatus as recited in claim 30, wherein at least one said multi-layer mirror condenser comprises a multi-layer spherical mirror condenser.

32. A lithography apparatus as recited in claim 30, wherein at least one said multi-layer mirror condenser comprises a multi-layer elliptical mirror condenser.

33. A lithography apparatus as recited in claim 30, wherein at least one said radiation source is selected from the group consisting essentially of a laser-plasma source, a synchrotron source, a discharge-capillary source, a z-pinch plasma source, a discharge-pump x-ray laser source, and an electron bombardment source.

34. A lithography method, comprising:

illuminating a beam of radiation on a mask; and imaging at least a portion of a pattern on said mask from said mask to a wafer by an achromatic Fresnel objective;

wherein at least one said achromatic Fresnel objective comprises a Fresnel zone plate and a refractive Fresnel lens on opposite sides of a common substrate.

35. A lithography method as in claim 34, further comprising:

using a step-scan method to print entire said pattern from said mask to said wafer.

36. A lithography method, comprising:

providing a radiation source;

reflecting a beam from said radiation source to a condenser;

illuminating a mask with a reflected beam from said condenser; and imaging at least a portion of a pattern on said mask from said mask to a wafer by using an achromatic Fresnel objective;

wherein at least one said achromatic Fresnel objective comprises a Fresnel zone plate and a refractive Fresnel lens on opposite sides of a common substrate.

37. A lithography method as in claim 36, further comprising:

using a step-scan method to print entire said pattern from said mask to said wafer.

38. A lithography method, comprising:

providing a radiation source;

illuminating a mask with said radiation source;

imaging at least a portion of a pattern on said mask from said mask to a wafer by using an achromatic Fresnel objective positioned optically between said mask and said wafer;

wherein at least one said achromatic Fresnel objective comprises a Fresnel zone plate and a refractive Fresnel lens on opposite sides of a common substrate.

39. A lithography method as in claim 38, further comprising:

using a step-scan method to print entire said pattern from said mask to said wafer.

* * * * *